(12) United States Patent
Hirano et al.

(10) Patent No.: US 6,388,306 B1
(45) Date of Patent: May 14, 2002

(54) SEMICONDUCTOR DEVICE WITH RAPID REVERSE RECOVERY CHARACTERISTIC

(75) Inventors: Noritoshi Hirano, Fukuoka; Katsumi Satoh, Tokyo, both of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1 day.

(21) Appl. No.: 09/619,316

(22) Filed: Jul. 18, 2000

(30) Foreign Application Priority Data

Jan. 28, 2000 (JP) ........................................ 2000-020407

(51) Int. Cl.7 .............................................. H01L 29/00
(52) U.S. Cl. ........................................ 257/551; 257/656
(58) Field of Search ................................ 257/657, 656, 257/655, 617, 612, 577, 156, 342, 333, 331, 330

(56) References Cited

U.S. PATENT DOCUMENTS

| | | | |
|---|---|---|---|
| 4,131,339 A | * 12/1978 | Dannhauser et al. ........... | 357/13 |
| 4,476,481 A | * 10/1984 | Iesaka et al. .................. | 357/58 |
| 4,594,602 A | * 6/1986 | Iimura et al. .................. | 357/13 |
| 4,623,910 A | * 11/1986 | Risberg ......................... | 357/38 |
| 5,075,740 A | * 12/1991 | Ohtsuka et al. ................ | 357/15 |
| 5,637,898 A | * 6/1997 | Baliga .......................... | 257/330 |
| 5,717,244 A | * 2/1998 | Soejima ........................ | 257/617 |

FOREIGN PATENT DOCUMENTS

| | | |
|---|---|---|
| JP | 8-148699 | 6/1996 |
| JP | 10-242165 | 9/1998 |

* cited by examiner

*Primary Examiner*—David Nelms
*Assistant Examiner*—Thinh Nguyen
(74) *Attorney, Agent, or Firm*—Oblon, Spivak, McClelland, Maier & Neustadt, P.C.

(57) ABSTRACT

An object is to obtain a semiconductor device having a PN junction which can suppress voltage oscillation without exerting any adverse effects. The film thickness of the $N^-$ layer (101) is set to satisfy both of a first condition that the depletion layer extending in the $N^-$ layer (101) from the PN junction between the $N^-$ layer (101) and the P layer (102) does not reach the $N^+$ layer (103) when a reverse voltage of about ½ to ⅔ of the voltage blocking capability of the diode is applied and a second condition that the depletion layer reaches the $N^+$ layer (103) when a reverse voltage exceeding about ⅔ of the voltage blocking capability is applied. Further, the impurity concentration (specific resistance) of the $N^-$ layer (101) is set so that the electric field which acts on the depletion layer when the reverse bias voltage is set equivalent to the voltage blocking capability does not exceed the maximum field strength of silicon.

9 Claims, 8 Drawing Sheets

SEMICONDUCTOR DEVICE WITH RAPID REVERSE RECOVERY CHARACTERISTIC

BACKGROUND OF THE INVENTION

1. Field of the Invention

The present invention relates to semiconductor devices such as a diode having a PN junction which is required to provide a high breakdown voltage and a rapid reverse recovery characteristic.

2. Description of the Background Art

Diodes are required to provide a high breakdown voltage and a rapid reverse recovery characteristic as flow-back diodes or voltage-clamping diodes needed in applications of high-voltage switching device such as IGBTs (Insulated Gate Bipolar Transistors) and GCTs (Gate Commutated Turn-off Thyristors).

FIG. 13 is a cross-sectional view showing a sectional structure of a conventional common diode which meets the needs stated above. As shown in this diagram, an $N^-$ layer 601 as a semiconductor substrate of silicon etc. is formed on an $N^+$ layer 603 and a P layer 602 is formed on the $N^-$ layer 601. The concentration of N-type impurity is higher in the $N^+$ layer 603 than in the $N^-$ layer 601.

An anode electrode 604 made of a low-resistant metal is formed on the P layer 602 and a cathode electrode 605 made of a low-resistant metal as well as the anode electrode 604 is formed under the $N^+$ layer 603.

The lifetime in the vicinity of the PN junction is controlled by proton irradiation etc. and a center of carrier recombination is formed. The lifetime in the entire semiconductor substrate is controlled and shortened by techniques such as diffusion of precious metal, irradiation of electron beam, etc.

When a reverse bias is applied to a diode in which a current is flowing in the forward direction by instantaneously switching an external circuit, the current once reaches zero but does not immediately recover in the reverse direction because of the accumulation of minority carriers in the diode, and a large reverse current (a current having a current decreasing rate determined by the reverse bias value and the inductance of the external circuit) transiently flows for a certain period. This reverse current flows until the excess carriers in the vicinity of the PN junction reduce below a certain concentration and a depletion layer is formed.

When a depletion layer is formed, a reverse voltage starts developing; the reverse voltage gradually increases as the depletion layer expands and the reverse current gradually decreases. Then the device voltage becomes steady equal to the applied reverse voltage and the reverse recovery operation is thus finished.

In a conventional diode having a structure like that shown in FIG. 13, the lifetime in the vicinity of the PN junction is locally controlled and shortened to realize characteristics of low forward voltage, small reverse recovery current (the peak value of the reverse current) and high di/dt strength (the maximum value of the current decreasing rate di/dt which can be given without damaging the diode).

However, when the reverse bias voltage is high in the reverse recovery operation, the applied voltage of the diode rapidly oscillates to generate such noise as may cause malfunction of the peripheral electric equipment. It is supposed that such voltage oscillation in diode is caused as shown below.

A diode in the reverse recovery operation has a capacitance component defined by the depletion layer and excess carriers as parameters and a resistance component defined by the applied voltage, leakage current and recombination current of the excess carries as parameters. The resistance component, the capacitance component and the inductance component of the external circuit for applying the reverse voltage form an LCR series circuit. The capacitance component and the resistance component of the diode vary with time. The resistance component rapidly increases when the excess carriers outside the depletion layer have disappeared, and the natural oscillation condition of the LCR series circuit is reached and voltage oscillation occurs. The resistance component rapidly varies to cause voltage oscillation also when the depletion layer reaches the $N^+$ layer 603.

SUMMARY OF THE INVENTION

According to a first aspect of the present invention, a semiconductor device comprises: a first conductivity type first semiconductor layer; a first conductivity type second semiconductor layer being formed on the first semiconductor layer, the second semiconductor layer having a lower impurity concentration of the first conductivity type than the first semiconductor layer; a second conductivity type third semiconductor layer being formed on the second semiconductor layer; a first main electrode formed over the third semiconductor layer; and a second main electrode formed under the first semiconductor layer; wherein the film thickness of the second semiconductor layer is set to satisfy both of a first condition that a depletion layer extending from a PN junction at an interface between the second semiconductor layer and the third semiconductor layer does not reach the first semiconductor layer when a reverse voltage of about ½ to ⅔ of the reverse-direction voltage blocking capability of the PN junction is applied to the first and second main electrodes, and a second condition that the depletion layer extending from the PN junction reaches the first semiconductor layer when a reverse voltage exceeding about ⅔ of the voltage blocking capability is applied to the first and second main electrodes.

Preferably, according to a second aspect of the invention, in the semiconductor device, the first main electrode includes a main electrode formed directly on the third semiconductor layer, and the second main electrode comprises a main electrode formed directly on the underside of the first semiconductor layer.

Preferably, according to a third aspect of the invention, the semiconductor device further comprises: a second conductivity type fourth semiconductor layer being formed under the first semiconductor layer, and wherein the first main electrode includes a main electrode formed directly on the third semiconductor layer and the second main electrode includes a main electrode formed directly on the underside of the fourth semiconductor layer.

Preferably, according to a fourth aspect of the invention, the semiconductor device further comprises: a second conductivity type fourth semiconductor layer being formed under the first semiconductor layer; and a first conductivity type fifth semiconductor layer being formed on the third semiconductor layer, and wherein the first main electrode includes a main electrode formed directly on the fifth semiconductor layer and the second main electrode includes a main electrode formed directly on the underside of the fourth semiconductor layer.

Preferably, according to a fifth aspect of the invention, in the semiconductor device, the third semiconductor layer comprises a plurality of semiconductor regions formed selectively in a surface of the second semiconductor layer, and the first main electrode comprises a plurality of partial electrodes formed on the plurality of semiconductor regions, respectively.

Preferably, according to a sixth aspect of the invention, in the semiconductor device, the lifetime in the vicinity of the interface between the second and third semiconductor layers is set shorter than the lifetime in the vicinity of the interface between the first and second semiconductor layers.

Preferably, according to a seventh aspect of the invention, in the semiconductor device, the second condition includes a condition that the depletion layer extending from the PN junction reaches the first semiconductor layer when a reverse voltage equivalent to the voltage blocking capability is applied to the first and second main electrodes.

Preferably, according to an eighth aspect of the invention, in the semiconductor device, the impurity concentration of the second semiconductor layer is set to satisfy a third condition that electric field which acts on the depletion layer when a reverse bias voltage equivalent to the voltage blocking capability is set is at an actual use level not more than a predetermined field strength.

Preferably, according to a ninth aspect of the invention, in the semiconductor device, the first conductivity type includes N type and the second conductivity type includes P type.

As described above, according to the semiconductor device of the first aspect of the invention, the film thickness of the second semiconductor layer is set to satisfy the first condition. Accordingly, it is possible to certainly suppress the voltage oscillation which would occur as the depletion layer reaches the first semiconductor layer when a reverse voltage of about ½ to ⅔ of the voltage blocking capability, which is generally used in the reverse recovery operation, is applied.

Furthermore, the film thickness of the second semiconductor layer is set to also satisfy the second condition, so that the on-state voltage can be maintained low at an appropriate level.

As a result, it is possible to desirably balance the on-state voltage reduction and suppression of the voltage oscillation.

The semiconductor device of the second aspect provides a diode which can achieve well-balanced on-state voltage reduction and voltage oscillation suppression.

The semiconductor device of the third aspect provides a transistor which can achieve well-balanced on-state voltage reduction and voltage oscillation suppression.

The semiconductor device of the fourth aspect provides a thyristor which can achieve well-balanced on-state voltage reduction and voltage oscillation suppression.

According to the semiconductor device of the fifth aspect, the plurality of semiconductor regions form PN junctions on their respective sides with the first semiconductor layer, which provides a diode with improved breakdown voltage.

According to the semiconductor device of the sixth aspect, setting the lifetime short in the vicinity of the interface between the second and third semiconductor layers (in the vicinity of the PN junction) suppresses expansion of the depletion layer from the PN junction, which allows the second semiconductor layer to be formed thinner.

The semiconductor device of the seventh aspect uses a voltage equivalent to the voltage blocking capability as the reverse voltage for the second condition, which provides a structure adapted to actual design.

According to the semiconductor device of the eighth aspect, the impurity concentration of the second semiconductor layer is set so that the electric field which acts on the depletion layer is at an actual use level not higher than a predetermined field strength when a reverse bias voltage corresponding to the voltage blocking capability is set, and therefore no problem is encountered in actual operation.

The present invention has been made to solve the problem above, and an object of the invention is to obtain a semiconductor device having a PN junction which can suppress voltage oscillation without causing any adverse effects.

These and other objects, features, aspects and advantages of the present invention will become more apparent from the following detailed description of the present invention when taken in conjunction with the accompanying drawings.

DESCRIPTION OF THE PREFERRED EMBODIMENTS

<Principle>

The basic structure of the invention is a three-layer structure of a P layer, an $N^-$ layer and an N– layer. In the structure of the first preferred embodiment described later, the P layer 102, $N^-$ layer 101 and $N^+$ layer 103 shown in FIG. 8 correspond to the P layer, $N^-$ layer and $N^+$ layer, respectively.

When a reverse recovery operation (the operation of recovering the reverse-direction voltage blocking capability when the PN junction is switched from a forward-direction conducting state to a reverse-direction blocking state) is applied to this basic-structure diode portion (PN junction), the resistance component rapidly varies when the depletion layer formed in the basic structure reaches the $N^+$ layer, which triggers voltage oscillation.

This voltage oscillation can be prevented by increasing the film thickness of the $N^-$ layer in the basic structure so that the depletion layer expanding in the $N^-$ layer from the PN junction between the P layer and the $N^-$ layer will not reach the $N^+$ layer. When the $N^-$ layer is merely thickened, however, the film thickness of the $N^-$ layer (the wafer thickness) becomes large and causes an increase in the on-state voltage.

On the other hand, a PIN structure with a small wafer thickness provides a low on-state voltage but it cannot avoid very large voltage oscillation since the depletion layer reaches the $N^+$ layer in the reverse recovery operation.

The present invention intends to obtain a basic structure which can desirably balance the reduction of on-state voltage and the suppression of voltage oscillation. It was found that the film thickness of the $N^-$ layer in the diode portion having the basic structure shall be set so that the depletion layer expanding in the $N^-$ layer from the PN junction between the P layer and the $N^-$ layer does not reach the $N^+$ layer when a reverse voltage corresponding to about ½ to ⅔ of the voltage blocking capability is applied and so that the depletion layer reaches the $N^+$ layer when a reverse voltage exceeding about. ⅔ of the voltage blocking capability is applied.

Figure 1:
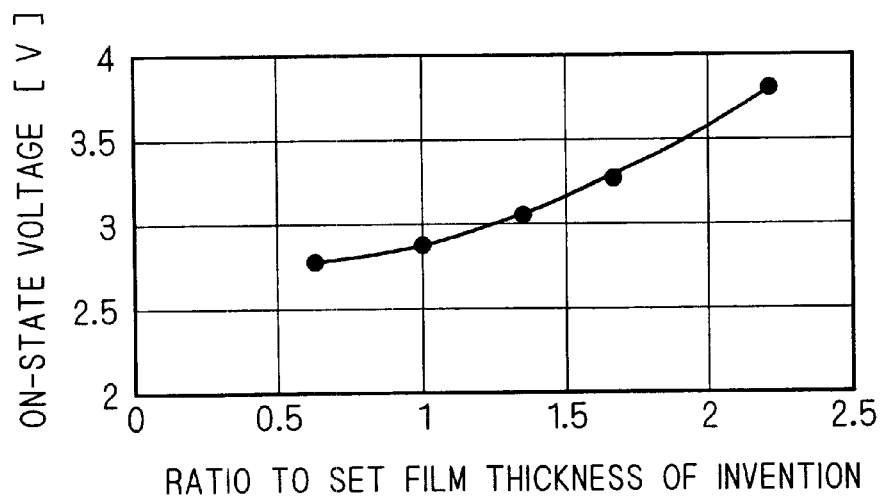
FIG. 1 is a graph showing the relation between the film thickness of the $N^-$ layer in a structure of the invention and the on-state voltage.

FIG. 1 is a graph showing the relation between the film thickness of the $N^-$ layer and the on-state voltage in the structure of the invention. In this diagram, the film thickness of the $N^-$ layer which is set according to the invention is taken as "1" (this film thickness is referred to as "set film thickness"hereinafter). As shown in this diagram, the on-state voltage rises when the film thickness of the $N^-$ layer becomes thicker over the set film thickness; when it is set twice the set film thickness, for example, the on-state voltage increases by as much as about 0.8 V. On the other hand, when the film thickness of the $N^-$ layer becomes thinner than the set film thickness, the on-voltage decreases. However, it decreases just at a small rate; the on-state voltage decreases by only about 0.1 to 0.2 V even when the thickness is set at half of the set film thickness, for example.

When a reverse voltage of about ⅔ or less of the voltage blocking capability is applied, the depletion layer expanding from the PN junction does not reach the $N^+$ layer, so that the magnitude of the voltage oscillation can be suppressed to almost zero.

Figure 2:
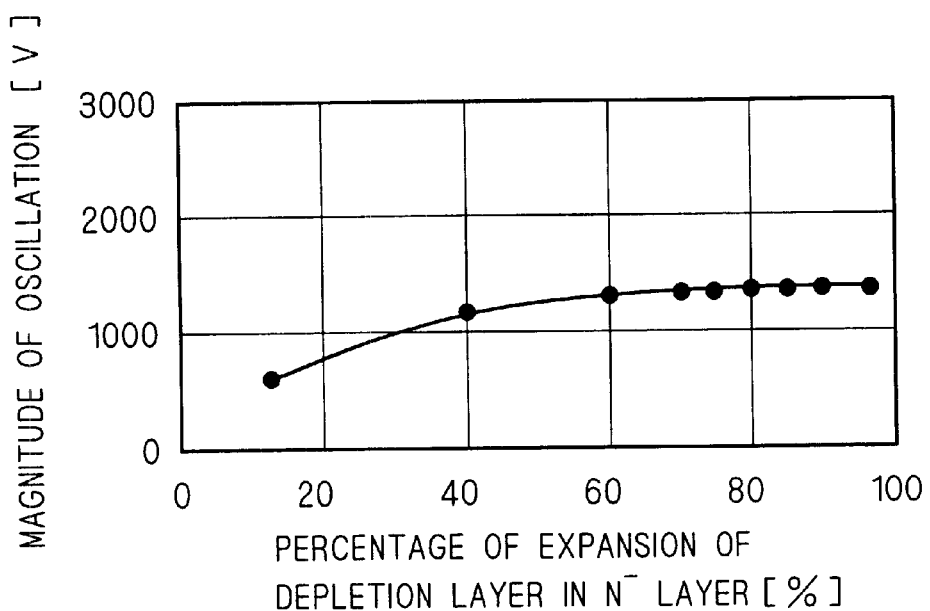
FIG. 2 is a graph showing the percentage of expansion of the depletion layer in the $N^-$ layer and the magnitude of voltage oscillation, where a reverse voltage exceeding ⅔ of the voltage blocking capability is applied.

FIG. 2 is a graph showing the percentage of the expansion of the depletion layer in the $N^-$ layer and the magnitude of the voltage oscillation, where a reverse voltage exceeding about ⅔ of the voltage blocking capability is applied. As shown in this diagram, when a reverse voltage exceeding about ⅔ of the voltage blocking capability is applied and the depletion layer reaches the $N^+$ layer and expands in the $N^+$ layer, the magnitude of the voltage oscillation is kept within the permissible range largely under 2 KV.

Figure 3:
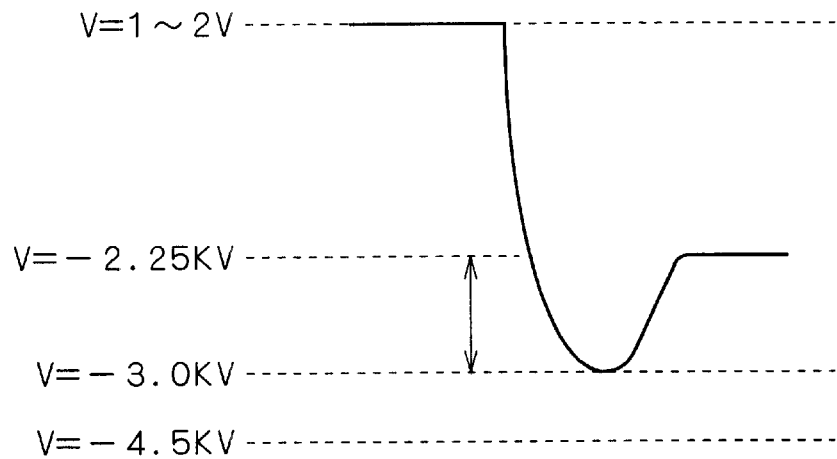
FIG. 3 is a waveform diagram showing a variation of the reverse bias voltage in a diode during a reverse recovery operation.

FIG. 3 is a waveform diagram showing an example of setting of the reverse bias in the reverse recovery operation. As shown in this diagram, a reverse bias is applied in a state in which a constant voltage of about 1 to 2 V is applied to the diode and a forward current is flowing. In this case, in general use, the peak value is set at about ⅔ of the voltage blocking capability and the steady-state voltage is set at about ½. For example, in a diode having a voltage blocking capability of −4.5 KV (the reverse direction is represented as "−"), the peak value is around −3 KV corresponding to about ⅔ thereof and the steady-state voltage is −2.25 KV corresponding to about ½.

Considering this condition, as stated above, the present invention sets the film thickness of the $N^-$ layer in the basic-structure diode portion so that the following two conditions are both satisfied: a first condition that the depletion layer expanding in the $N^-$ layer does not reach the $N^+$ layer when a reverse voltage corresponding to about ½ to ⅔ of the voltage blocking capability is applied, and a second condition that the depletion layer reaches the $N^+$ layer when a reverse voltage exceeding about ⅔ of the voltage blocking capability is applied.

As stated above, as the reverse bias is set at about ½ to ⅔ of the voltage blocking capability in the reverse recovery operation, the film thickness of the $N^-$ layer satisfies the first condition so that the depletion layer expanding in the $N^-$ layer does not reach the $N^+$ layer in this period. Accordingly, it is possible to effectively suppress the voltage oscillation as stated above.

Further, the film thickness of the $N^-$ layer is set thin enough to satisfy the second condition, so that the on-state voltage can be set at an appropriate low level.

Moreover, to obtain strength enough to endure actual use, the impurity concentration (specific resistance) of the $N^-$ layer is set to satisfy a third condition that the electric field which acts on the depletion layer is at an actual use level not more than the maximum field strength of silicon (the maximum value of the field strength that silicon can withstand) when the reverse bias voltage is set at about ⅓ of the voltage blocking capability.

In practice, the impurity concentration and the film thickness of the $N^-$ layer are determined considering mutual relations between the first to third conditions, since the impurity concentration of the $N^-$ layer is related to the expansion of the depletion layer.

Figure 4:
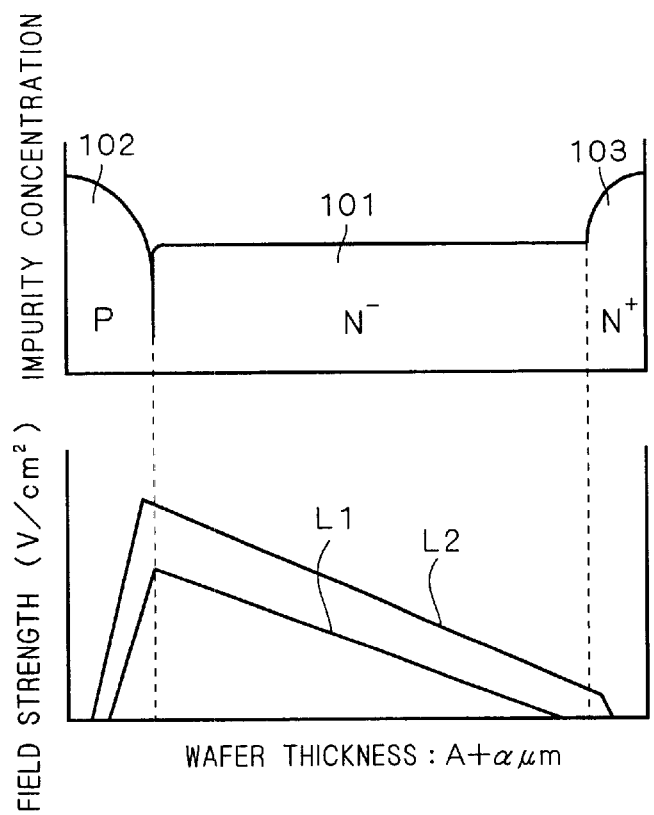
FIG. 4 is an explanation diagram showing a feature of the structure of the invention.

FIG. 4 is an explanation diagram showing a feature of the structure of the invention. As shown in FIG. 4, the present invention adopts a three-layer structure of the P layer 102, $N^-$ layer 101 and $N^+$ layer 103 as the basic structure, which exhibits the electric field distribution shown as L1 where the depletion layer forming from the PN junction between the $N^-$ layer 101 and the P layer 102 does not reach the $N^+$ layer 103 when a reverse voltage of about ½ to ⅔ of the voltage blocking capability is applied, and which exhibits the electric field distribution shown as L2 where the depletion layer reaches the $N^+$ layer 103 when a reverse voltage exceeding about ⅔ of the voltage blocking capability is applied.

Figure 5:
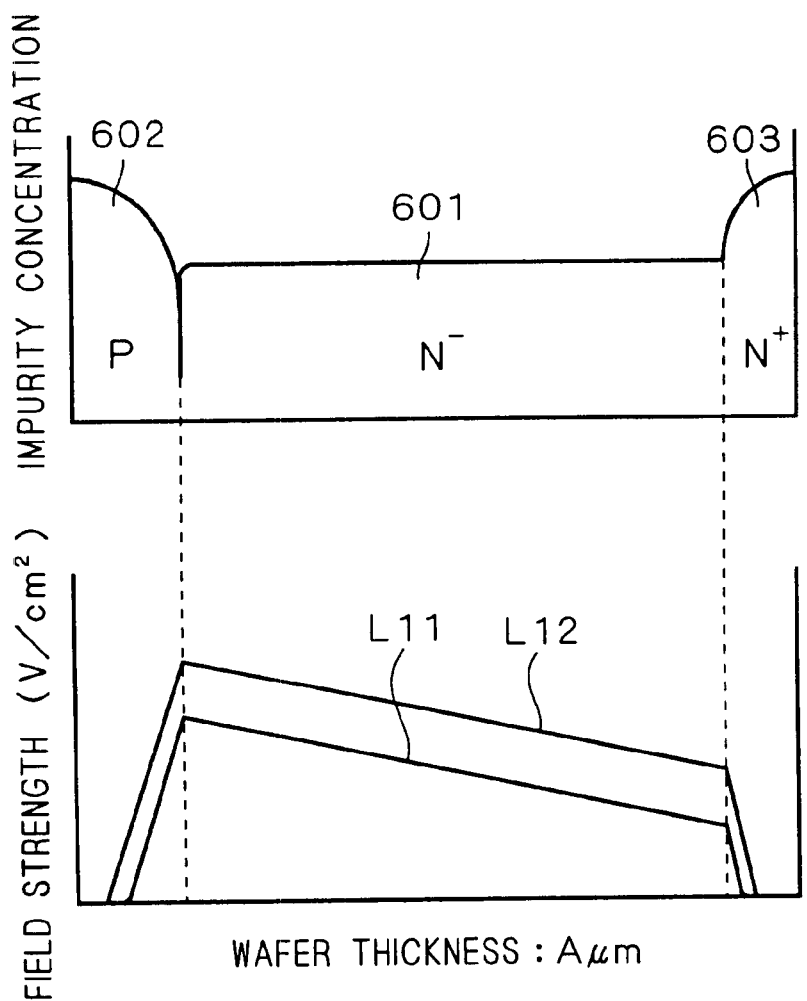
FIG. 5 is an explanation diagram showing a feature of a diode having a conventional PIN structure.
Figure 13:
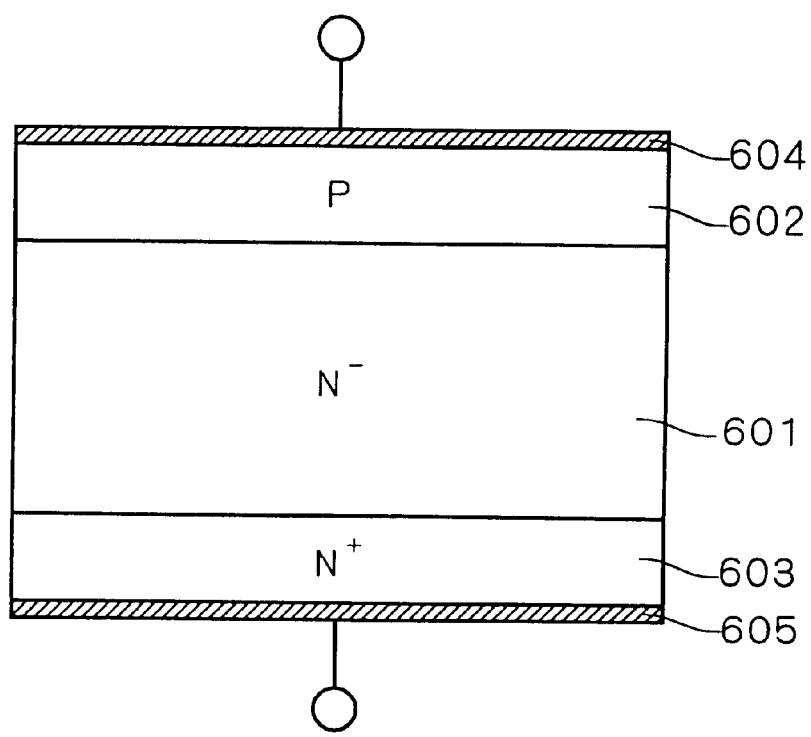
FIG. 13 is a cross-sectional view showing a sectional structure of a conventional common diode.

FIG. 5 is an explanation diagram showing a feature of the conventional PIN diode shown in FIG. 13. As shown in this diagram, the basic structure of the PIN structure is a three-layer structure composed of the P layer 602, $N^-$ layer 601 and $N^+$ layer 603, where the depletion layer formed from the PN junction between the $N^-$ layer 601 and the P layer 602 when a reverse voltage of about ½ to ⅔ of the voltage blocking capability is applied and the depletion layer formed from the PN junction when a reverse voltage exceeding about ⅔ of the voltage blocking capability is applied both reach the $N^+$ layer 603. The diagram shows the electric field distribution in the former case as L11 and the electric filed distribution in the latter case as L12.

Figure 6:
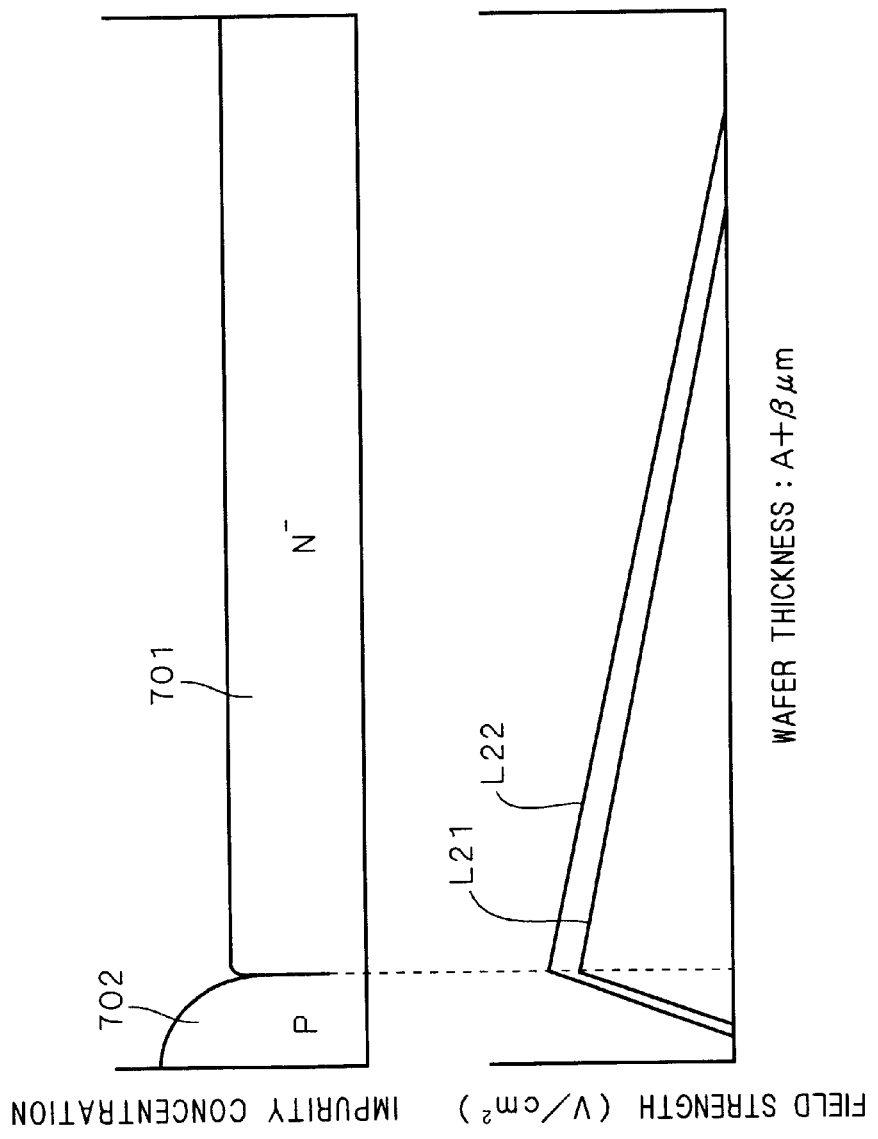
FIG. 6 is an explanation diagram showing a feature of a diode having a PN junction structure.

FIG. 6 is an explanation diagram showing a feature of a diode having a simple PN junction structure. As shown in this diagram, the basic structure of the simple PN junction structure is a two-layer structure composed of a P layer 702 and an N⁻ layer 701, where the depletion layer formed from the PN junction between the N⁻ layer 601 and the P layer 602 when a reverse voltage of about ½ to ⅔ of the voltage blocking capability is applied, and the depletion layer formed when a reverse voltage exceeding about ⅔ of the voltage blocking capability is applied both do not reach the N⁺ layer 63. The diagram shows the electric filed distribution in the former case as L21 and the electric field distribution in the latter case as L22.

Thus, when conditions other than the film thickness of the N⁻ layer are set equal and the film thickness of the N⁻ layer 601 in the PIN structure is assumed to be A μm, then the film thickness of the N⁻ layer 101 is (A+α(>0))μm and the film thickness of the N⁻ layer 701 is (A+β(>α))μm.

Figure 7:
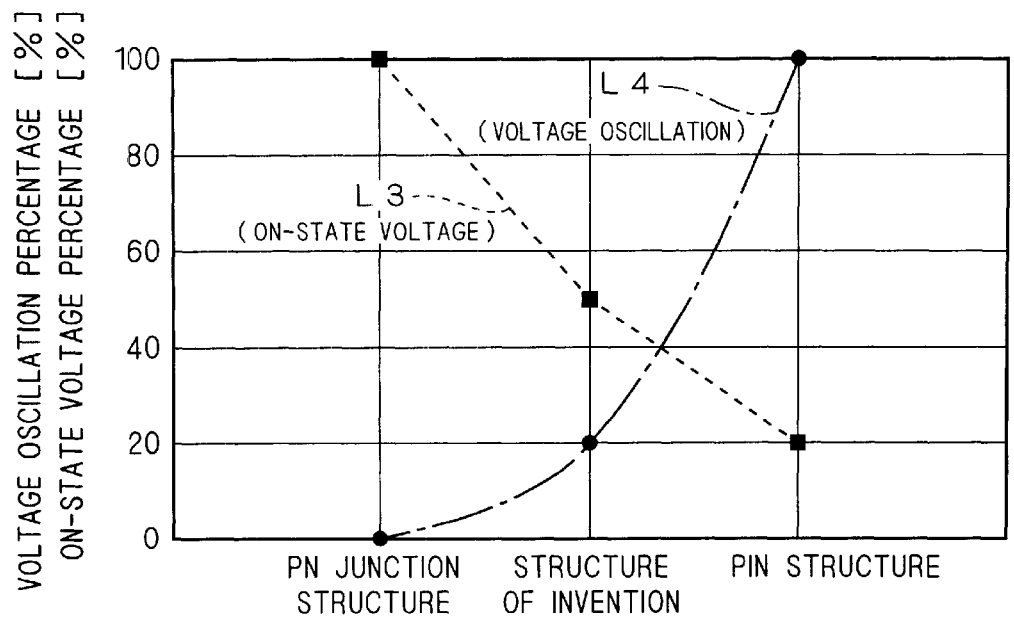
FIG. 7 is a graph showing the percentage of on-state voltage and the percentage of voltage oscillation in the structure of the invention, PIN structure and PN junction structure.

FIG. 7 is a graph showing the percentage of the on-state voltage and that of the voltage oscillation in the structure of the invention, the PIN structure and the PN junction structure. As shown by the on-state voltage curve L3 and the voltage oscillation curve L4 in the diagram, the structure of the invention can achieve a more desirable balance between the on-state voltage reduction and the voltage oscillation suppression as compared with the conventional PIN structure and PN junction structure.

It is preferred for actual design that a voltage equivalent to the voltage blocking capability is adopted as the voltage exceeding about ⅔ of the voltage blocking capability of the second condition, so that a voltage equivalent to the voltage blocking capability is adopted as the reverse voltage for the second condition in the preferred embodiments described below.

<First Preferred Embodiment>

Figure 8:
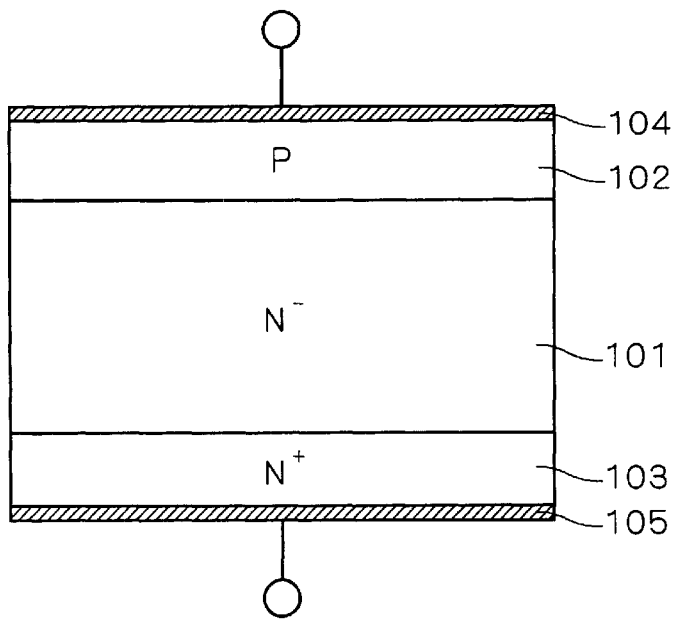
FIG. 8 is a cross-sectional view showing the structure of a semiconductor device according to a first preferred embodiment of the invention.

FIG. 8 is a cross-sectional view showing the structure of a semiconductor device according to a first preferred embodiment of the invention. As shown in this diagram, an N⁻ layer 101 as a semiconductor substrate made of silicon etc. is formed on an N⁺ layer 103 and a P layer 102 is formed on the N⁻ layer 101, where the impurity concentration is higher in the N⁺ layer 103 than in the N⁻ layer 101.

An anode electrode 104 made of a low-resistant metal is formed on the P layer 102 and a cathode electrode 105 made of a low-resistant metal as well as the anode electrode 104 is formed under the N⁺ layer 103.

The semiconductor device of the first preferred embodiment thus forms a diode composed of the P layer 102, (N⁻ layer 101 and N⁺ layer 103).

In this structure, as has been described above, the film thickness of the N⁻ layer 101 is set to satisfy both of the first condition that the depletion layer extending in the N⁻ layer 101 from the PN junction between the N⁻ layer 101 and the P layer 102 does not reach the N⁺ layer 103 when a reverse voltage of about ½ to ⅔ of the voltage blocking capability of the PN junction of this diode is applied and the second condition that the depletion layer reaches the N⁺ layer 103 when a reverse voltage of about ¹⁄₁ of the voltage blocking capability is applied.

Further, the impurity concentration (specific resistance) of the N⁻ layer 101 is set so that the electric field which acts on the depletion layer when a reverse bias voltage is set at about ¹⁄₁ of the voltage blocking capability is not more than the maximum field strength of silicon.

The structure of the first preferred embodiment provides a diode which can desirably balance the on-state voltage reduction and the voltage oscillation reduction.

Actual applications of the first preferred embodiment include an example in which the N⁻ layer 101 has a film thickness as the wafer thickness of 600 μm, the P layer 102 has a film thickness of 90 μm and the N⁺ layer 103 has a film thickness of 40 μm, with the impurity concentration of the P layer 102 being $5.0 \times 10^{23}$ atom/m³, the impurity concentration of the N⁻ layer 101 being $2.1 \times 10^{19}$ atom/m³ (specific resistance 2.2Ω·m), and the impurity concentration of the N⁺ layer 103 being $1.0 \times 10^{20}$ atom/m³, where the voltage blocking capability is about 4.5 KV.

<Second Preferred Embodiment>

Figure 9:
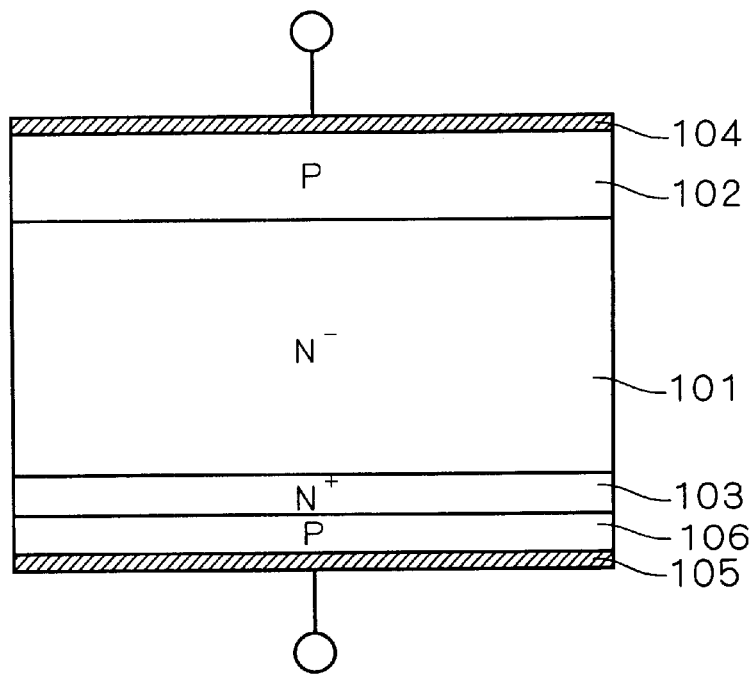
FIG. 9 is a cross-sectional view showing the structure of a semiconductor device according to a second preferred embodiment of the invention.

FIG. 9 is a cross-sectional view showing the structure of a semiconductor device according to a second preferred embodiment of the invention. As shown in this diagram, a P layer 106 is interposed between the N⁺ layer 103 and the cathode electrode 105. In other respects, this structure is the same as that shown in FIG. 8 in the first preferred embodiment and therefore it is not described in detail again here.

The semiconductor device of the second preferred embodiment thus forms a PNP bipolar transistor composed of the P layer 102, (N⁻ layer 101, N⁺ layer 103) and the P layer 106. The bipolar transistor having the structure of the second preferred embodiment can achieve well-balanced on-state voltage reduction and voltage oscillation reduction.

<Third Preferred Embodiment>

Figure 10:
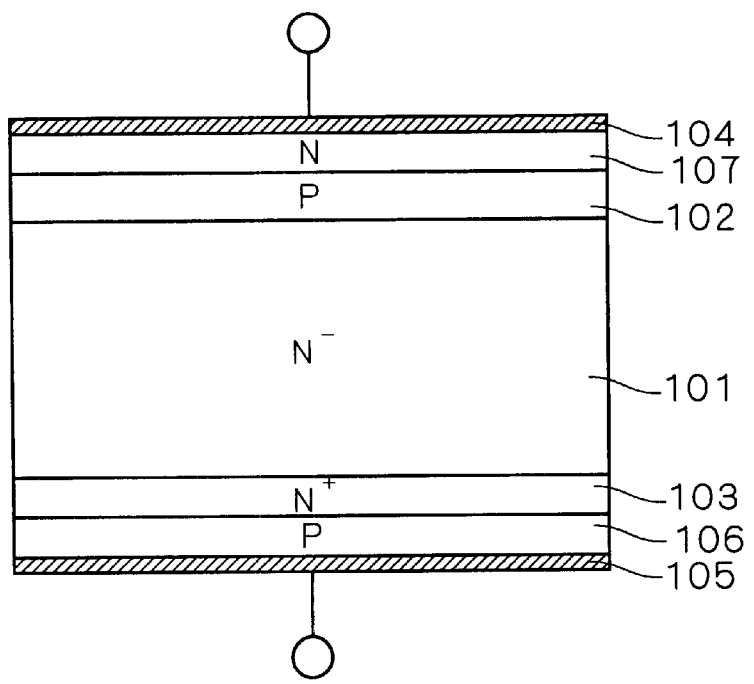
FIG. 10 is a cross-sectional view showing the structure of a semiconductor device according to a third preferred embodiment of the invention.

FIG. 10 is a cross-sectional view showing the structure of a semiconductor device according to a third preferred embodiment of the invention. As shown in this diagram, an N layer 107 is interposed between the P layer 102 and the anode electrode 104. In other respects, this structure is the same as that shown in FIG. 9 in the second preferred embodiment and therefore it is not described in detail again here.

The semiconductor device of the third preferred embodiment thus forms an NPNP thyristor composed of the N layer 107, P layer 102, (N⁻ layer 101, N⁺ layer 103) and P layer 106. The thyristor having the structure of the third preferred embodiment can achieve well-balanced on-state voltage reduction and voltage oscillation reduction.

<Fourth Preferred Embodiment>

Figure 11:
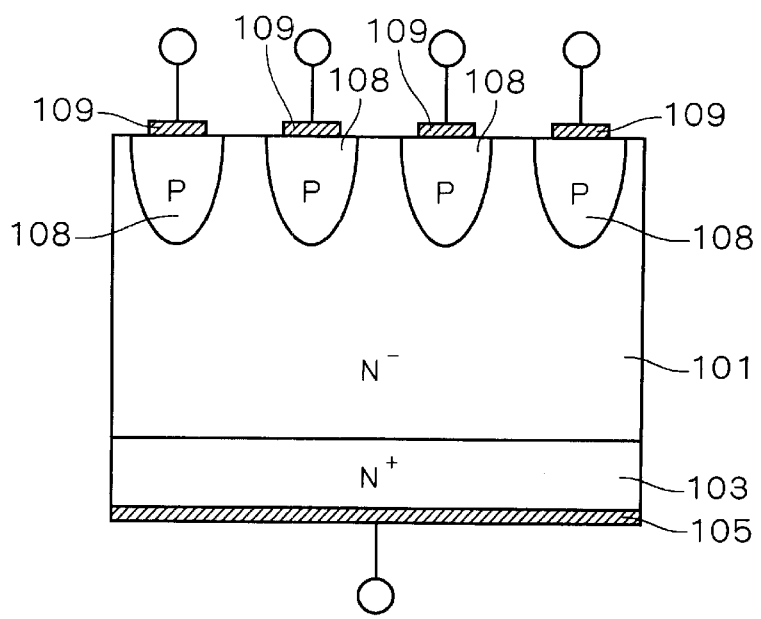
FIG. 11 is a cross-sectional view showing the structure of a semiconductor device according to a fourth preferred embodiment of the invention.

FIG. 11 is a cross-sectional view showing the structure of a semiconductor device according to a fourth preferred embodiment of the invention. As shown in this diagram, a plurality of P regions 108 are selectively formed in the surface of the N⁻ layer 101 in place of the P layer 102 shown in FIG. 8 of the first preferred embodiment. Further, partial anode electrodes 109 are formed respectively on the plurality of P regions 108. In other respects, this structure is the same as that shown in FIG. 8 of the first preferred embodiment and therefore it is not described in detail here again.

According to the structure of the fourth preferred embodiment, the respective sides of the plurality of P regions 108 form PN junctions with the N⁻ layer, which provides a diode having a more improved breakdown voltage than that of the first preferred embodiment.

<Fifth Preferred Embodiment>

Figure 12:
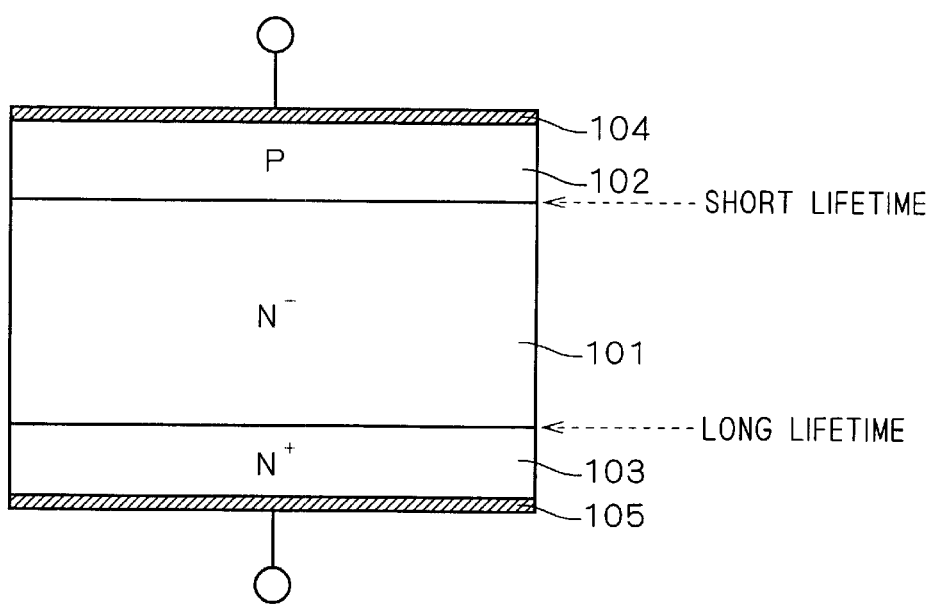
FIG. 12 is a cross-sectional view showing the structure of a semiconductor device according to a fifth preferred embodiment of the invention.

FIG. 12 is a cross-sectional view showing the structure of a semiconductor device according to a fifth preferred embodiment of the invention. The structure of the fifth preferred embodiment is almost equivalent to that shown in FIG. 8 of the first preferred embodiment. However, this structure differs from that in that it is controlled so that the lifetime in the vicinity of the junction between the P layer 102 and the N⁻ layer 101 is shorter than the lifetime in the vicinity of the junction between the N⁻ layer 101 and the N⁺ layer 103.

In the structure of the fifth preferred embodiment, setting the lifetime shorter in the vicinity of the PN junction between the N⁻ layer 101 and the P layer 102 suppresses expansion of the depletion layer in the N⁻ layer 101 from the PN junction between the N⁻ layer 101 and the P layer 102. Accordingly, when other conditions are assumed to be equal, the first to third conditions above can be satisfied even if the film thickness of the N⁻ layer 101 is set thinner than that in the first preferred embodiment.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
    a first conductivity type first semiconductor layer;
    a first conductivity type second semiconductor layer being formed on said first semiconductor layer, said second semiconductor layer having a lower impurity concentration of the first conductivity type than said first semiconductor layer;
    a second conductivity type third semiconductor layer being formed on said second semiconductor layer;
    a first main electrode formed over said third semiconductor layer; and
    a second main electrode formed under said first semiconductor layer;
    wherein the film thickness of said second semiconductor layer is set to satisfy both of a first condition that a depletion layer extending from a PN junction at an interface between said second semiconductor layer and said third semiconductor layer does not reach said first semiconductor layer when a reverse voltage of about ½ to ⅔ of the reverse-direction voltage blocking capability of said PN junction is applied to said first and second main electrodes, and a second condition that the depletion layer extending from said PN junction reaches said first semiconductor layer when a reverse voltage exceeding about ⅔ of said voltage blocking capability is applied to said first and second main electrodes.

2. The semiconductor device according to claim 1, wherein
    said first main electrode includes a main electrode formed directly on said third semiconductor layer, and
    said second main electrode comprises a main electrode formed directly on the underside of said first semiconductor layer.

3. The semiconductor device according to claim 1, further comprising:
    a second conductivity type fourth semiconductor layer <106> being formed under said first semiconductor layer, wherein
    said first main electrode includes a main electrode formed directly on said third semiconductor layer, and
    said second main electrode includes a main electrode formed directly on the underside of said fourth semiconductor layer.

4. The semiconductor device according to claim 1, further comprising:
    a second conductivity type fourth semiconductor layer being formed under said first semiconductor layer; and
    a first conductivity type fifth semiconductor layer being formed on said third semiconductor layer, wherein
    said first main electrode includes a main electrode formed directly on said fifth semiconductor layer, and
    said second main electrode includes a main electrode formed directly on the underside of said fourth semiconductor layer.

5. The semiconductor device according to claim 2, wherein
    said third semiconductor layer comprises a plurality of semiconductor regions formed selectively in a surface of said second semiconductor layer, and
    said first main electrode comprises a plurality of partial electrodes formed on said plurality of semiconductor regions, respectively.

6. The semiconductor device according to claim 2, wherein
    the lifetime in the vicinity of the interface between said second and third semiconductor layers is set shorter than the lifetime in the vicinity of the interface between said first and second semiconductor layers.

7. The semiconductor device according to claim 1, wherein
    said second condition includes a condition that the depletion layer extending from said PN junction reaches said first semiconductor layer when a reverse voltage equivalent to said voltage blocking capability is applied to said first and second main electrodes.

8. The semiconductor device according to claim 1, wherein
    said impurity concentration of said second semiconductor layer is set to satisfy a third condition that electric field which acts on said depletion layer when a reverse bias voltage equivalent to said voltage blocking capability is set is at an actual use level not more than a predetermined field strength.

9. The semiconductor device according to claim 1, wherein
    said first conductivity type includes N type, and
    said second conductivity type includes P type.

* * * * *